United States Patent [19]
Heitzer et al.

[11] Patent Number: 5,304,858
[45] Date of Patent: Apr. 19, 1994

[54] APPARATUS FOR MAINTAINING A LOW POWER LOSS WITHIN AN INPUT STAGE FOR DIGITAL SIGNALS

[75] Inventors: Herbert Heitzer, Kuemmersbruck; Gerhard Rumold, Bubenreuth, both of Fed. Rep. of Germany

[73] Assignee: Siemens Aktiengesellschaft, Munich, Fed. Rep. of Germany

[21] Appl. No.: 913,112

[22] Filed: Jul. 14, 1992

[30] Foreign Application Priority Data

Jul. 25, 1991 [EP] European Pat. Off. ........ 91112521.9

[51] Int. Cl.$^5$ ...................... H03K 3/313; H03K 3/15
[52] U.S. Cl. .................................... 307/290; 307/303; 307/322
[58] Field of Search ............ 307/290, 302, 303, 303.1, 307/311, 322, 296.3, 242, 268, 324; 328/148

[56] References Cited

U.S. PATENT DOCUMENTS

| | | | |
|---|---|---|---|
| 2,923,840 | 2/1960 | Ellsworth | 307/268 |
| 3,219,935 | 11/1965 | Katakami | 307/268 |
| 3,371,226 | 2/1968 | Ortel | 307/322 |
| 3,525,038 | 8/1970 | Felt et al. | 307/322 |
| 3,581,122 | 5/1971 | Gaunt | 307/322 |
| 4,443,716 | 4/1984 | Avery | 307/303 |
| 4,574,276 | 3/1986 | Sato | 328/148 |
| 5,013,933 | 5/1991 | Eisenhart | 307/296.3 |

FOREIGN PATENT DOCUMENTS

| | | |
|---|---|---|
| 0111028 | 6/1984 | European Pat. Off. . |
| 2814856 | 10/1979 | Fed. Rep. of Germany . |
| 2948358 | 6/1981 | Fed. Rep. of Germany . |
| 2637752 | 4/1990 | France . |
| 0512858 | 10/1971 | Switzerland . |

Primary Examiner—William L. Sikes
Assistant Examiner—My Trang Ton
Attorney, Agent, or Firm—Kenyon & Kenyon

[57] ABSTRACT

An input stage for programmable controllers in which a Schmitt trigger and a two-terminal configuration having a negative resistance characteristic are combined in an integrated circuit. A first resistor supplementing this bipolar configuration to form a constant-current sink is connected externally of the integrated circuit in parallel with the bipolar configuration. A power loss mainly develops in the first resistor which is external of the integrated circuit so that multi-channel input stages are able to be realized cost-effectively without requiring a supply of cooling air to cool the integrated circuit. A second resistor may be connected external of the integrated circuit in series with the two-terminal configuration to further reduce power loss within the integrated circuit and to limit the current flowing into the integrated circuit.

12 Claims, 3 Drawing Sheets

APPARATUS FOR MAINTAINING A LOW POWER LOSS WITHIN AN INPUT STAGE FOR DIGITAL SIGNALS

BACKGROUND OF THE INVENTION

The present invention relates to an input stage for digital signals, as used as a peripheral input interface for process computers and programmable controllers. Such peripheral modules are needed in one installation in a relatively large number and one attempts to keep the power loss, which develops in them and is converted into heat, as low as possible, so that a non-ventilated operation with natural air cooling is possible without having to supply cooling air.

The German Patent No. 28 14 856 discloses a trigger circuit for a light-emitting diode, which circuit is linked via a current limiting resistor to two input terminals capable of receiving signal voltage. In this case, the light-emitting diode is triggered by a Schmitt trigger, which is likewise connected up to the input voltage. The Schmitt trigger short-circuits the light-emitting diode on the output side in dependence upon the value of the signal voltage. Instead of a current limiting resistor, this patent proposes using an arrangement which receives a constant current. This provides the advantage of minimal power loss when voltage values vary. This known trigger circuit can be used for the isolated transmission of digital signals with an optocoupler, for example, as an input device for digital control systems.

To achieve economical manufacturing with a large number of pieces it is advantageous to implement input stages using of modern semiconductor technology, that is to realize the input stages as integrated circuits. The power loss arising in the integrated circuit under field conditions must be kept low enough, so that this circuit is not destroyed by the generation of heat. In particular, when several similar input ports are to be combined in a shared circuit, this power-loss limit is very quickly exceeded (for example, in the case of input stages intended for programmable controllers) and can no longer be observed without extensive measures in many applications. As a result of the minimum current stipulated for compatibility reasons by international standards for the "on" state of the input stage, expensive power housings for the circuit are necessary, especially in the case of a multi-channel configuration.

SUMMARY OF THE INVENTION

The present invention includes an input stage with low power loss, which can be inexpensively manufactured using modern semiconductor technology. The present invention allows a power loss to develop, which is already minimized per se as the result of the application of a constant-current sink, largely outside of the integrated circuit.

The present invention includes an input stage for programmable controllers in which a Schmitt trigger and a bipolar configuration having a negative resistance characteristic are combined in an integrated circuit. A first resistor supplementing this bipolar configuration to form a constant-current sink is connected externally of the integrated circuit in parallel with the bipolar configuration. A power loss mainly develops in the first resistor which is external of the integrated circuit so that multi-channel input stages are able to be realized cost-effectively without requiring a supply of cooling air to cool the integrated circuit. A second resistor may be connected external of the integrated circuit in a series connection with the bipolar configuration to further reduce power loss within the integrated circuit and to limit the current flowing into the integrated circuit.

BRIEF DESCRIPTION OF THE DRAWINGS

The present invention may be understood from the following description taken in conjunction with the accompanying drawings, wherein.

DETAILED DESCRIPTION

Figure 1:
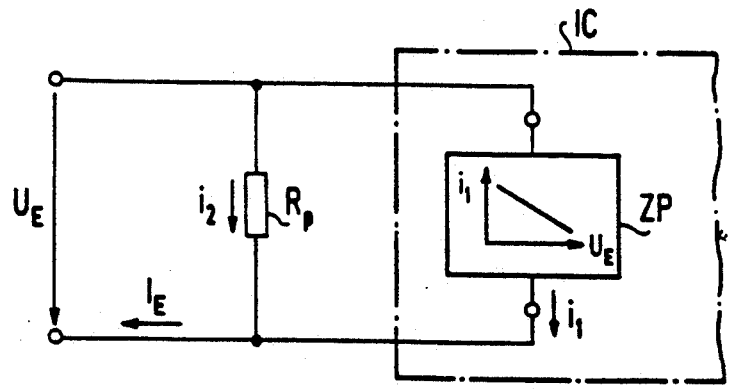
FIG. 1 illustrates a design of a constant-current sink according to an embodiment of the present invention.

FIG. 1 illustrates the design in principle of a constant-current sink according to the present invention. A two-terminal configuration denoted by ZP and having a negative resistance characteristic is implemented in an integrated circuit IC. A negative resistance characteristic, as also represented by the characteristic curve depicted in the block symbol of the two-terminal network ZP, means that the current $i_1$ flowing through the two-terminal network decreases when the voltage $U_E$ applied to the two-terminal network ZP increases. The depicted characteristic curve can be analytically described by the equation $$i_1 = i_0 - m \cdot U_E$$

whereby $i_0$ and m are constant, specifiable variables. A resistor $R_p$, traversed by the current $i_2$, is allocated to the two-terminal network externally of the integrated circuit. It follows then for the total current of the current sink that $I_E = i_2 + i_1 = i_0 + U_E(1/R_p - m)$, since $i_2 = U_E/R_p$. The ohmic resistance value $R_p$ of the resistor allocated in parallel with the two-terminal network and externally of the integrated circuit and the gradient m of the current-voltage characteristic of the two-terminal network ZP are now selected so that $m = 1/R_p$. The resistor $R_p$ supplements the bipolar configuration ZP to a constant-current sink. That is, the current flowing through the total configuration depicted in FIG. 1 becomes independent of the input voltage $U_E$ applied at any one time. Corresponding to each rise in the current $i_2$ due to an increase in the input voltage $U_E$ then is an equal decrease in the current flowing through the two-terminal network ZP and vice versa. In this design of the constant-current sink according to the present invention, when the input voltage $U_E$ and thus the power loss are altogether the greatest, the current $i_1$ flowing through the two-terminal network is the smallest and, therefore, only a fraction of this power loss arises in the integrated circuit.

Constant-current sinks of the type described above are able to be constructed with known two-terminal networks having a negative resistance characteristic, as described, together with their adjustment, for example in Swiss Patent No. 512 858.

Figure 2:
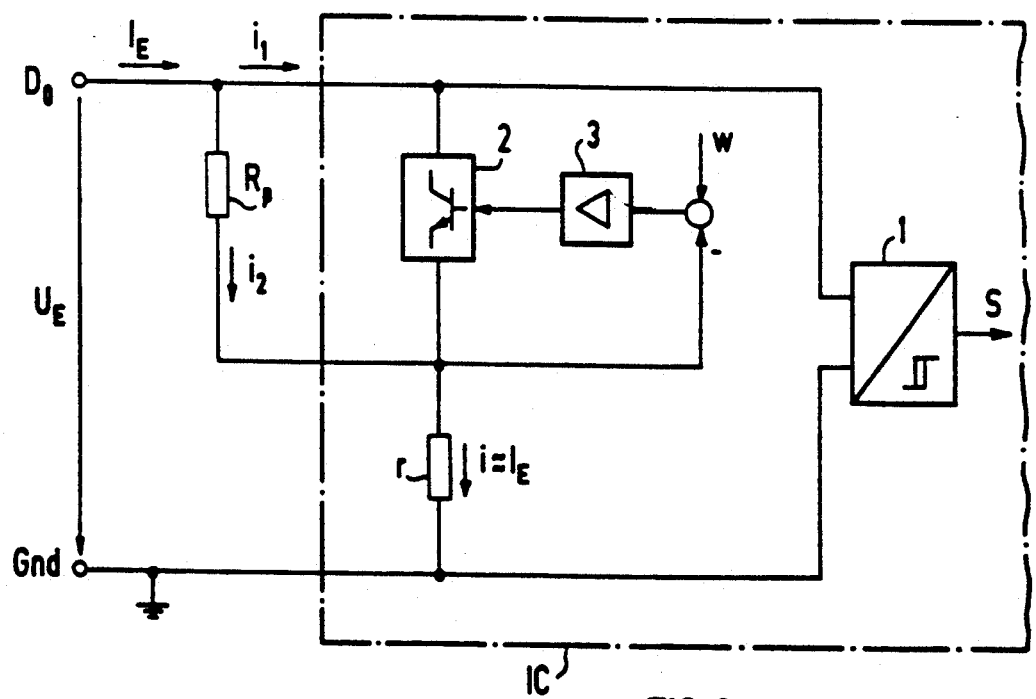
FIG. 2 depicts a basic form of the input stage according to an embodiment of the present invention.

FIG. 2 shows a simple way to set up the input stage according to the present invention with a constant-current sink according to FIG. 1. A Schmitt trigger 1 is situated in the integrated circuit IC. Schmitt trigger 1 receives the input voltage $U_E$ that is connected up to the terminals $D_0$ and Gnd (ground) and emits a signal S representing the "on" state of the input stage when the input voltage $U_E$ exceeds a specific minimum value. In input stages for programmable controllers, this value is set by standard regulations to 11 V. At the same time, the regulations also specify that the current $I_E$ consumed by the input stage in this condition has a value of at least 6 mA.

The constant-current sink consisting of the resistor $R_p$ and the collector-emitter section of a transistor 2 connected in parallel to this is effectively dimensioned for this minimum current value. In other words, the resistance value of the resistor $R_p$ arranged externally of the integrated circuit is dimensioned to be so great that at a maximum value of the input voltage $U_{Emax}$, a current $I_{Emin}$ is provided which lies slightly above this minimum current of 6 mA. At this value of the input voltage $U_E$, the two-terminal configuration existing in the collector-emitter section of the transistor 2 exhibits such a large resistance value that it carries virtually no current. If the input voltage is reduced from this maximum value, then a corresponding driving of the transistor 2 brings about a reduction in the resistance value of the collector-emitter section. This driving is achieved by means of an output signal from a current regulator in the form of the amplifier 3, to which a reference signal proportional to the mentioned minimum current value $I_{Emin}$ is fed as a setpoint value, and the voltage that is dropping off on a shunt r connected in series to the transistor 2 is fed as an actual value. The resistor r can thereby have quite a small value. If the setpoint value consists in the constant value $w = r \cdot I_{Emin}$, then by acting appropriately on the controlled system of the transistor 2, the current regulator 3 varies the transistor's resistance until the system deviation reaches the value zero, so that while disregarding the very small current consumption of the Schmitt trigger 1, it applies that $$r \cdot I_{Emin} = r \cdot i \approx r \cdot I_E \text{ or } I_E = I_{Emin} = \text{constant}.$$

In this manner, the input current $I_E$ of the input stage can be kept constant, whereby as the result of the previously mentioned dimensioning of the circuit-external resistor $R_p$ at the maximum input voltage $U_{Emax}$, the thereby occurring maximum power loss develops exclusively in the resistor $R_p$, and in the case of a dropping input voltage, the bipolar configuration having a negative resistance characteristic implemented using the transistor 2 increasingly receives more current. The largest value of the power loss to be taken up by the integrated circuit IC results when the same current flows in both branches of the parallel connection consisting of the resistor $R_p$ and the transistor 2 and then amounts to approximately one fourth of the maximum power loss $U_{Emax} \cdot I_{Emin}$.

Figure 3:
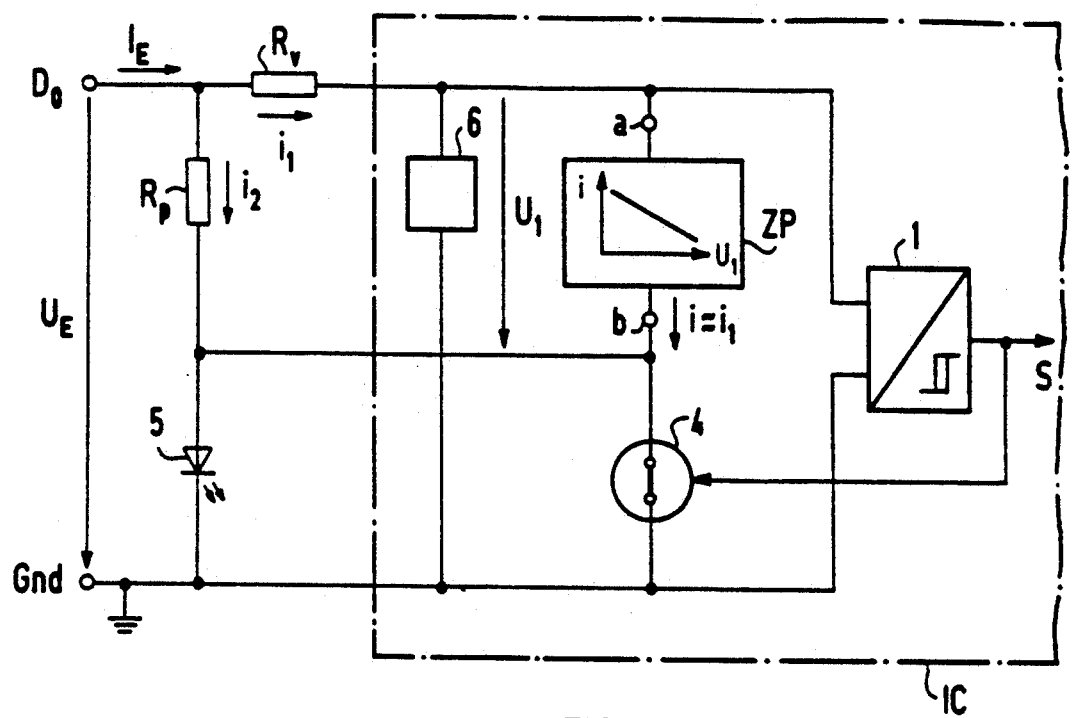
FIG. 3 illustrates a functionally enriched embodiment of the present invention with a particularly low power loss occurring within the integrated circuit.

FIG. 3 depicts a specific embodiment of the input stage according to the present invention which is functionally enriched compared to the configuration of FIG. 2 and in which the power loss in the integrated circuit is again reduced. In addition, it contains an integrated switch 4, which is actuated by the output signal S from the Schmitt trigger 1, so that it is opened when signal S reaches the "on" state and thus gives rise to a current flow through a light-emitting diode 5 previously short-circuited by switch 4. By this means, the "on" state can be made visible outside the integrated circuit. The circuit diagram of FIG. 3 also indicates a suppressor circuit 6 which essentially consists of diodes connected to ground (Gnd) and is supposed to ensure in a generally known way defined voltage potentials within the integrated circuit.

A circuit-external resistor $R_v$ is inserted in the branch of the constant-current sink containing the two-terminal network ZP with a negative resistance characteristic. Resistor $R_v$ serves as a current limiting resistor for the protective circuit 6 and the Schmitt trigger 1. Above all, however, resistor $R_v$ relieves the two-terminal network ZP in terms of voltage. Given the same loading in terms of current as in the configuration according to FIG. 2, the two-terminal network ZP receives a voltage which is reduced by the amount of the voltage drop across the resistor $R_v$ which is connected in series with network ZP. Consequently, a considerable reduction in the power loss arising in the integrated circuit IC can be achieved compared to the embodiment of FIG. 2.

If the voltage drop across the two-terminal network ZP is designated as $U_1$ and the current flowing through network ZP is designated as i, then the current-voltage characteristic of the two-terminal network ZP can again be described analytically as $i = i_0 - m \cdot U_1$. It was recognized at this point however, that the selection must be made for $m = 1/(R_v + R_p)$ and for $i_0 = I_{Emin}/(1 + R_v/R_p)$, so that given a variable input voltage $U_E$, the input current $I_E$ always has the constant value $I_{Emin}$.

Figure 4:
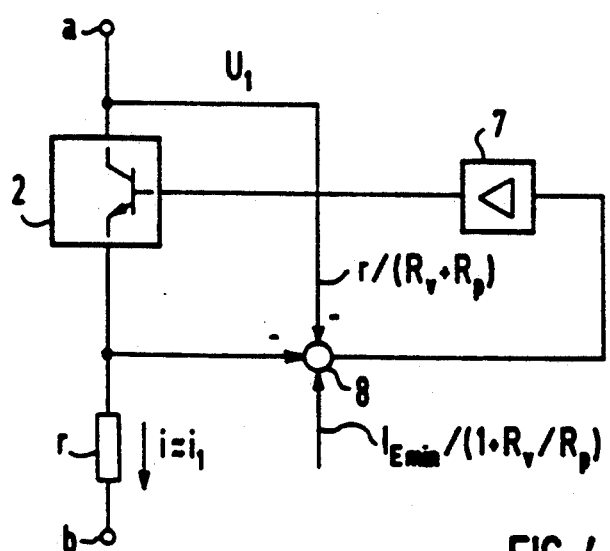
FIG. 4 illustrates the realization of a two-terminal configuration with a negative resistance characteristic.

FIG. 4 depicts a circuit arrangement, with which the resistance characteristic required for the constant-current quality can be realized for the two-terminal network to be provided between points a and b. This quality is forced, in turn, by the output signal from a current regulator 7, which now, however, does not regulate the total current of the current sink, but rather only the current in its branch containing the two-terminal network. The actual value of this branch current i, which while disregarding the low current consumption of the suppressor circuit 6 and the Schmitt trigger 1, corresponds to the current $i_1$ through the series resistor $R_v$, is collected as a voltage drop at a shunt r and fed to a mixing element 8. The setpoint value consists in the constant value $i_0 \cdot r$, whereby $i_0 = I_{Emin}(1 + R_v/R_p)$. In addition, the voltage $U_1$ weighted with the constant factor $r/(R_v + R_p)$ is fed in a subtractive process to the mixing element 8. The current regulator 7 now controls the collector-emitter resistor of the transistor 2 by appropriately acting on its controlled system until the control balance condition is reached, that is until $$r \cdot I_{Emin}/(1 + R_v/R_p) - r \cdot U_1/(R_v + R_p) - r \cdot i_1 = 0$$

or $$i_1 = I_{Emin}/(1 + R_v/R_p) - u_1/(R_v + R_p).$$

Thus, the current regulator 7 forces the resistance characteristic required for the constant-current quality of the total configuration for the two-terminal network to be provided between points a and b.

In the interest of having the greatest possible voltage relief for the two-terminal network ZP provided in the integrated circuit IC, the series resistor $R_v$ should be selected to be as large as possible. If the possible range of values varies during the "on" state of the input stage between the minimum voltage $U_{Emin}$ mentioned at the outset and the maximum voltage $U_{Emax}$ to be expected, then the relationship $R_v \leq R_p/(U_{Emax}/U_{Emin}-1)$ results for permissible values of the series resistor $R_v$.

Figure 5:
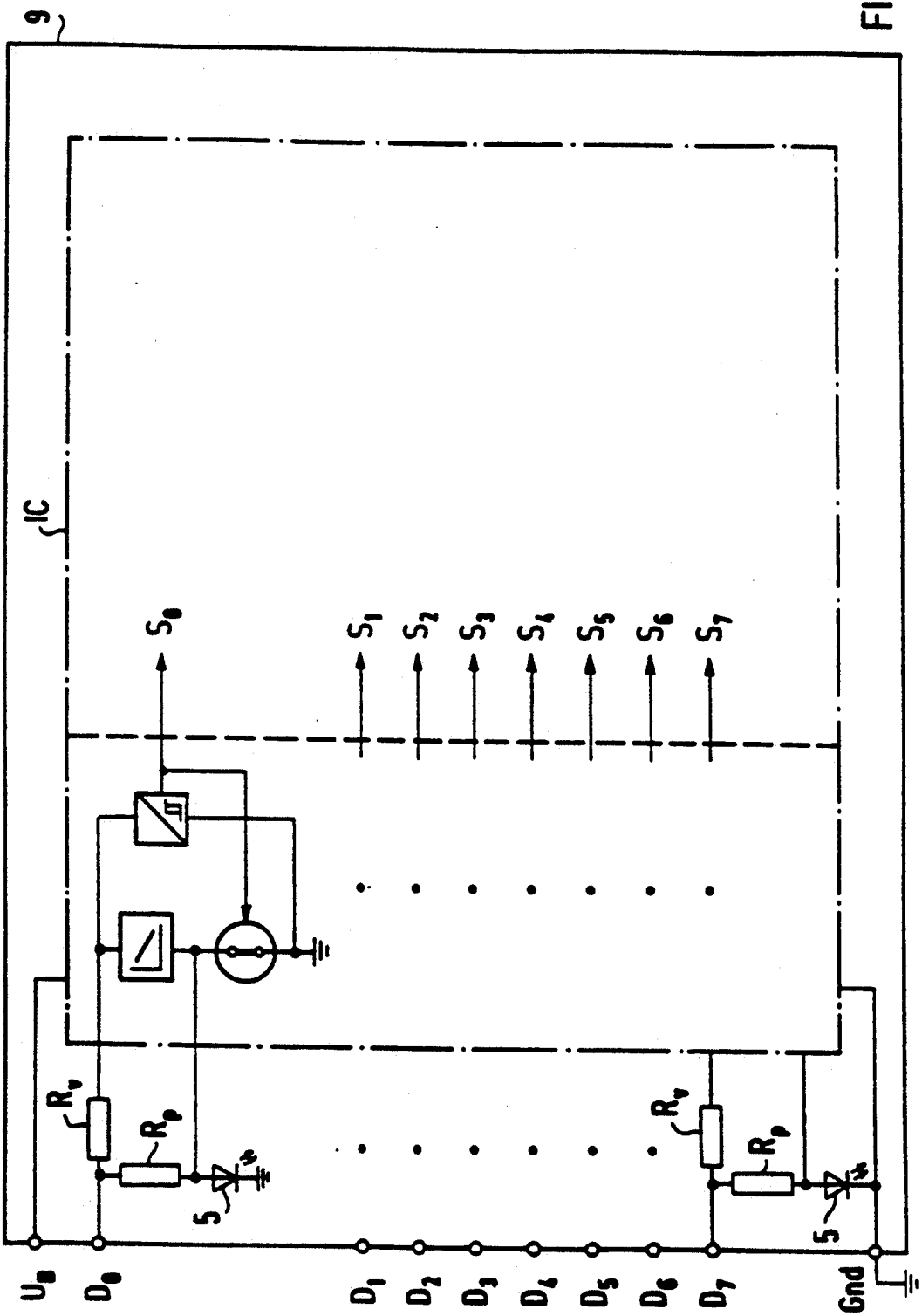
FIG. 5 illustrates a multi-channel design of the input stage on a printed circuit board.

Since the largest part of the power loss to be taken from the integrated circuit is consistently displaced into $R_v$ and $R_p$ which are external of the integrated circuit, it is possible to give the input stage a multichannel design using integrated technology. FIG. 5 illustrates an example of such a design. An input stage for monitoring eight input voltages, which is connected up to terminals or plug-in connectors $D_0-D_7$, is realized on a subrack (printed circuit board) 9. Furthermore, the subrack also has two terminals denoted by $U_B$ and Gnd (ground) for supplying the operating voltage. Each input voltage is applied to a constant-current sink according to the type of arrangement depicted in FIG. 3. A shunt resistor $R_p$, a series resistor $R_v$ and a status diode 5 are arranged on the subrack 9 for each of the input voltages outside of the integrated circuit IC. The signals $S_0-S_7$ supplied by the individual Schmitt triggers are further processed within the integrated circuit IC.

What is claimed is:

1. An apparatus including an integrated circuit, said apparatus comprising:
    a) an input stage having a Schmitt trigger disposed within the integrated circuit for receiving an input voltage, wherein said input stage outputs a signal representing an ON state when the input voltage exceeds a predetermined value;
    b) a two-terminal network having a negative resistance characteristic, being disposed within the integrated circuit and being coupled in parallel with the input stage; and
    c) a first resistor being disposed outside of the integrated circuit, and being coupled in parallel with the input stage, whereby the two-terminal network maintains a current flowing through the input stage at an approximately constant value so that as the input voltage increases increasing power loss is developed externally to the integrated circuit in the first resistor rather than in the input stage.

2. The apparatus according to claim 1, wherein said Schmitt trigger input stage further comprises a signal potential terminal and a reference potential terminal, and said two-terminal network further comprises:
    a) a transistor having a control terminal, a first terminal and a second terminal, wherein the first terminal is coupled to the signal potential terminal;
    b) a measuring resistor being coupled between the second terminal of the transistor and the reference potential terminal; and
    c) a current controller maintaining a current flowing through the measuring resistor at said approximately constant value, having an output being coupled to the control terminal of the transistor, and having an actual-value input being coupled to the second terminal of the transistor.

3. The apparatus according to claim 2, wherein said first resistor is coupled between the signal potential terminal and the second terminal of the transistor.

4. The apparatus according to claim 2, wherein said first resistor is coupled between the signal potential terminal and the reference potential terminal.

5. The apparatus according to claim 4, wherein said Schmitt Trigger input stage further comprising:
    a) a switch being controlled by the Schmitt trigger and being disposed within the input stage; and
    b) a light-emitting diode being disposed external to the integrated circuit and being coupled in series with the first resistor and being coupled in parallel with the switch.

6. The apparatus according to claim 2, further comprising a second resistor being disposed externally of the integrated circuit and being coupled in series with said two-terminal network.

7. The apparatus according to claim 6, wherein said Schmitt Trigger input stage further comprising:
    a) a switch being controlled by the Schmitt trigger and being disposed within the input stage; and
    b) a light-emitting diode being disposed external to the integrated circuit and being coupled in series with the first resistor and being coupled in parallel with the switch.

8. The apparatus according to claim 6, wherein said increasing power loss develops in said second resistor.

9. The apparatus according to claim 8, wherein said Schmitt Trigger input stage further comprising:
    a) a switch being controlled by the Schmitt trigger and being disposed within the input stage; and
    b) a light-emitting diode being disposed external to the integrated circuit and being coupled in series with the first resistor and being coupled in parallel with the switch.

10. The apparatus according to claim 2, wherein said Schmitt Trigger input stage further comprising:
    a) a switch being controlled by the Schmitt trigger and being disposed within the input stage; and
    b) a light-emitting diode being disposed external to the integrated circuit and being coupled in series with the first resistor and being coupled in parallel with the switch.

11. The apparatus according to claim 1, further comprising a second resistor being disposed externally of the integrated circuit and being coupled in series with said two-terminal network.

12. The apparatus according to claim 11, wherein said increasing power loss develops in said second resistor.

* * * * *